United States Patent
Inaba et al.

(10) Patent No.: US 10,454,416 B2
(45) Date of Patent: Oct. 22, 2019

(54) SOLAR BATTERY MODULE

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventors: Hirotaka Inaba, Kariya (JP); Kazumasa Okumura, Kariya (JP); Motoya Sakabe, Nisshin (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/682,846

(22) Filed: Aug. 22, 2017

(65) Prior Publication Data

US 2018/0062575 A1    Mar. 1, 2018

(30) Foreign Application Priority Data

Aug. 23, 2016 (JP) ................. 2016-162639

(51) Int. Cl.
| | |
|---|---|
| *H02S 40/36* | (2014.01) |
| *H02S 20/23* | (2014.01) |
| *F24S 25/20* | (2018.01) |
| *H01L 31/048* | (2014.01) |
| *H01L 31/05* | (2014.01) |
| *F24S 20/00* | (2018.01) |

(52) U.S. Cl.
CPC .............. *H02S 40/36* (2014.12); *F24S 25/20* (2018.05); *H01L 31/048* (2013.01); *H01L 31/0504* (2013.01); *H02S 20/23* (2014.12); *F24S 2020/13* (2018.05); *Y02B 10/12* (2013.01); *Y02E 10/50* (2013.01)

(58) Field of Classification Search
CPC .................................................. H01L 31/0504
See application file for complete search history.

(56) References Cited

U.S. PATENT DOCUMENTS

| | | | | |
|---|---|---|---|---|
| 6,156,967 A | * | 12/2000 | Ralph | ............. H01L 31/022441 |
| | | | | 136/244 |
| 6,218,606 B1 | | 4/2001 | Morizane et al. | |
| 6,262,358 B1 | * | 7/2001 | Kamimura | ............ H01L 31/048 |
| | | | | 136/244 |
| 6,307,144 B1 | | 10/2001 | Mimura et al. | |

(Continued)

FOREIGN PATENT DOCUMENTS

| | | |
|---|---|---|
| EP | 1030376 A1 | 8/2000 |
| EP | 2169727 A1 | 3/2010 |

(Continued)

*Primary Examiner* — Sadie White
(74) *Attorney, Agent, or Firm* — Sughrue Mion, PLLC

(57) ABSTRACT

Provided is a solar battery module easy to assemble. A solar battery module includes a connecting member, the connecting member includes a conductor disposed along an end of a first solar battery string and connected to the first solar battery string and a conductor disposed along an end of a second solar battery string and connected to the second solar battery string, and the first solar battery string and the second solar battery string are electrically connected.

5 Claims, 5 Drawing Sheets

(56) References Cited

U.S. PATENT DOCUMENTS

| | | | |
|---|---|---|---|
| 2005/0263179 A1* | 12/2005 | Gaudiana | H01G 9/2027 |
| | | | 136/244 |
| 2010/0078058 A1* | 4/2010 | Nightingale | H01L 31/02021 |
| | | | 136/244 |
| 2010/0132793 A1* | 6/2010 | Nakamua | H01L 31/048 |
| | | | 136/259 |
| 2013/0139871 A1* | 6/2013 | Hirata | H01L 31/0504 |
| | | | 136/251 |
| 2014/0202518 A1 | 7/2014 | Tabe et al. | |
| 2015/0340527 A1 | 11/2015 | Motonaga et al. | |
| 2016/0276509 A1 | 9/2016 | Mitsuzawa et al. | |
| 2017/0141253 A1 | 5/2017 | Ishii et al. | |

FOREIGN PATENT DOCUMENTS

| | | |
|---|---|---|
| JP | 2000-114572 A | 4/2000 |
| JP | 2002246628 A | 8/2002 |
| JP | 2016-171274 A | 9/2016 |
| WO | 2013046773 A1 | 4/2013 |
| WO | 2016/031232 A1 | 3/2016 |
| WO | 2017/175748 A1 | 10/2017 |

* cited by examiner

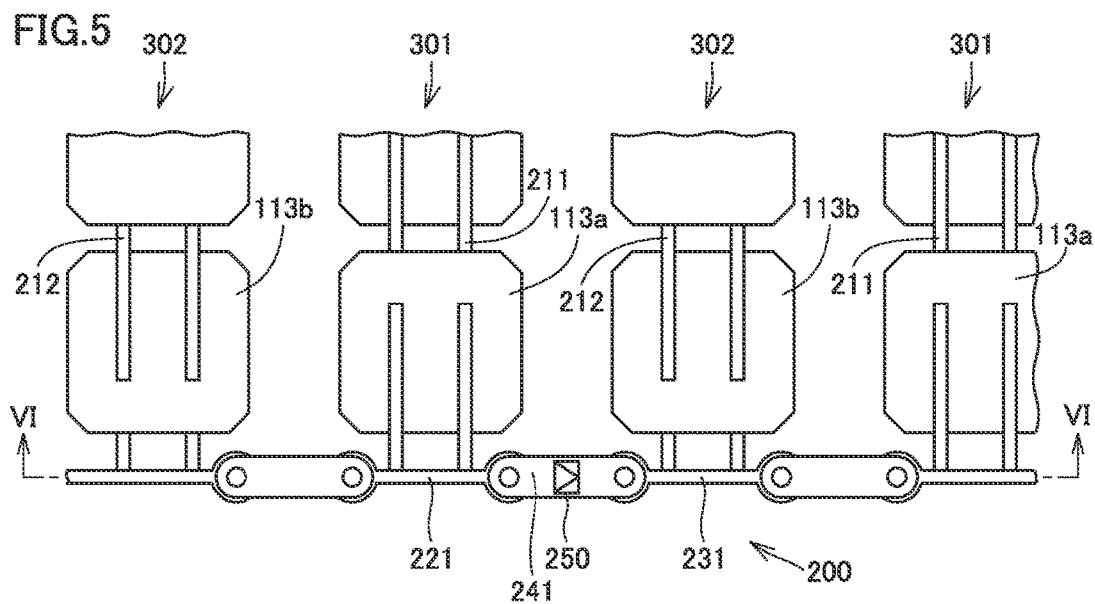

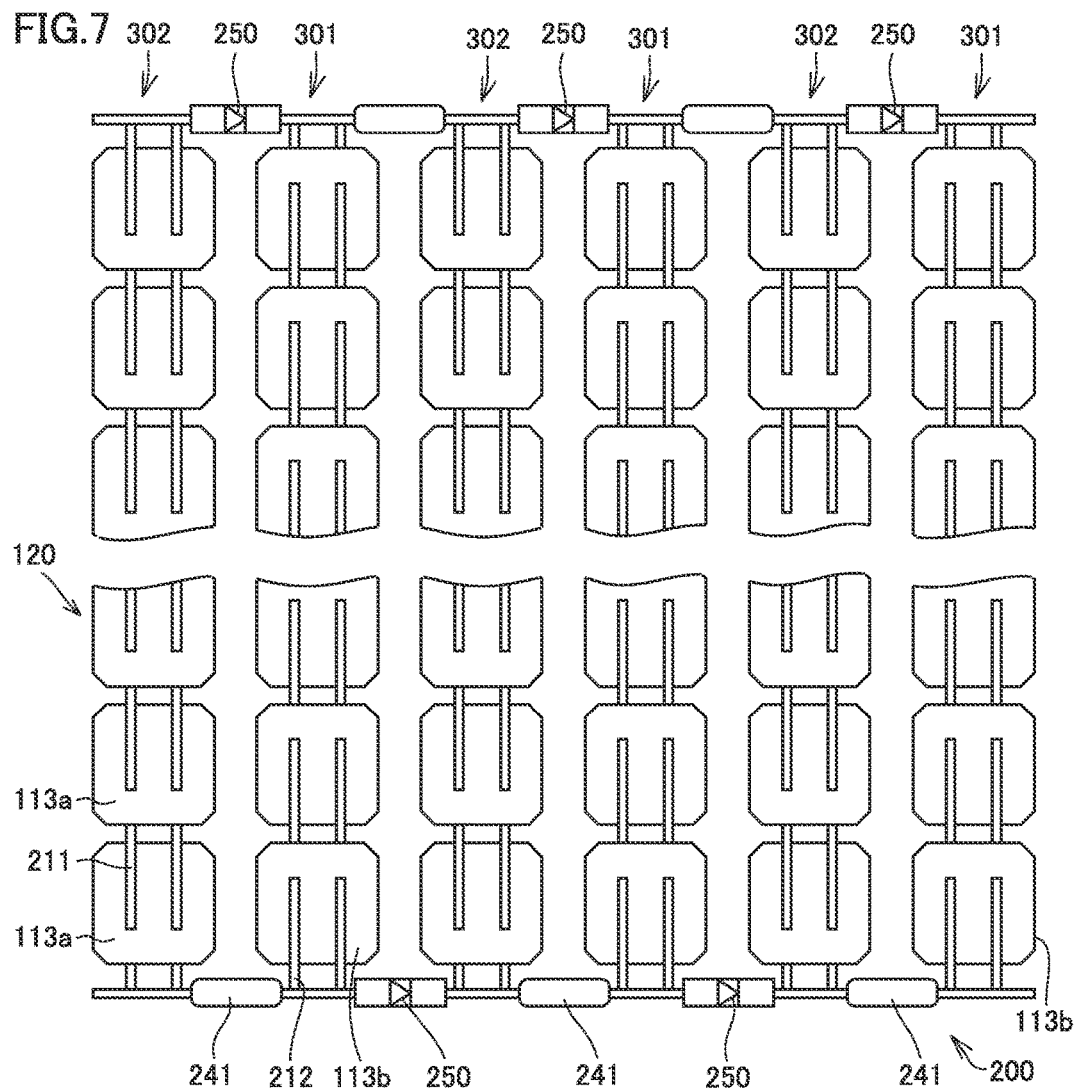

SOLAR BATTERY MODULE

This nonprovisional application is based on Japanese Patent Application No. 2016-162639 filed on Aug. 23, 2016, with the Japan Patent Office, the entire contents of which are hereby incorporated by reference.

BACKGROUND OF THE INVENTION

Field of the Invention

The present invention relates to a solar battery module, and more specifically to a solar battery module to be mounted on a vehicle.

Description of the Background Art

Japanese Patent Laying-Open No. 2000-114572 discloses a technique to collect wirings at one place by a connecting wiring in order to dispose a diode at one place.

SUMMARY OF THE INVENTION

According to the present disclosure, a solar battery module comprises: a first cover in the form of an at least partially transparent plate; a second cover disposed to face the first cover; a first string disposed between the first cover and the second cover and having a plurality of first solar battery cells electrically connected together to form the first string; a second string disposed between the first cover and the second cover adjacent to the first string and having a plurality of second solar battery cells electrically connected together to form the second string; a connecting member disposed between the first cover and the second cover along an end of the first string and an end of the second string and electrically connecting the first string and the second string; and a sealing material filling a gap between the first cover and the second cover and bonding them together to seal the first and second strings and the connecting member, the connecting member including a first conductor disposed along the end of the first string and connected to the first string and a second conductor disposed along the end of the second string and connected to the second string, the first conductor and the second conductor being electrically connected.

BRIEF DESCRIPTION OF THE DRAWINGS

FIG. 5 is a plan view showing a portion of a solar battery module according to a second embodiment of the present invention.

FIG. 6 is a cross-sectional view taken along a line VI-VI in FIG. 5.

FIG. 7 is a plan view of the solar battery module according to the second embodiment of the present invention.

DESCRIPTION OF THE PREFERRED EMBODIMENTS

Figure 1:
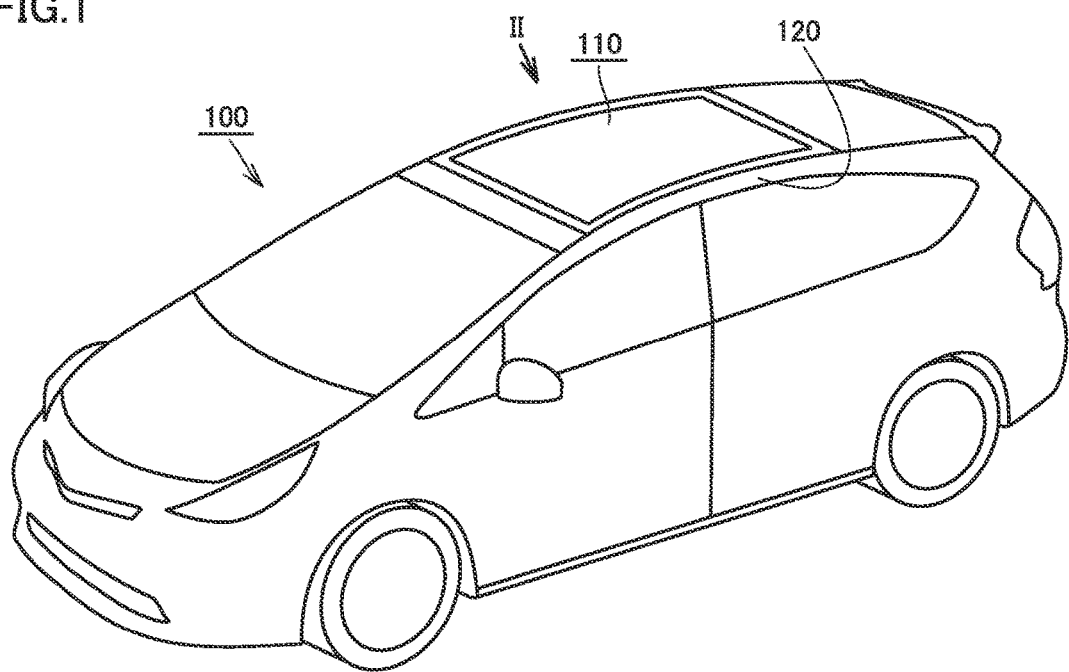
FIG. 1 is a perspective view showing an appearance of a vehicle according to a first embodiment of the present invention.

In the conventional art, normally, an operation to electrically connect a connecting wiring to electrically connect solar battery strings each having a plurality of solar battery cells connected in series is required to be performed in a state in which parts are disposed on a cover before a process is performed to laminate a solar battery module. In the technique described in Japanese Patent No. 3269051, wirings are collected at one place, and it is thus difficult to assemble a plurality of wirings and solar battery cells to a cover.

The present invention has been made to solve the above problem, and contemplates a solar battery module which facilitates assembling a plurality of wirings and solar battery cells to a cover.

According to the present disclosure, a solar battery module comprises: a first cover in the form of an at least partially transparent plate; a second cover disposed to face the first cover; a first string disposed between the first cover and the second cover and having a plurality of first solar battery cells electrically connected together to form the first string; a second string disposed between the first cover and the second cover adjacent to the first string and having a plurality of second solar battery cells electrically connected together to form the second string; a connecting member disposed between the first cover and the second cover along an end of the first string and an end of the second string and electrically connecting the first string and the second string; and a sealing material filling a gap between the first cover and the second cover and bonding them together to seal the first and second strings and the connecting member, the connecting member including a first conductor disposed along the end of the first string and connected to the first string and a second conductor disposed along the end of the second string and connected to the second string, the first conductor and the second conductor being electrically connected.

In the solar battery module configured as described above, the connecting member electrically connecting the first string and the second string is divided into a first conductor disposed along the first string and a second conductor disposed along the second string. Accordingly, in a state where the first and second strings are not connected, one of the first and second strings can be assembled to a cover, and subsequently, the other can be assembled to the cover. As a result, the first and second strings can be easily assembled to the cover.

Preferably, the first cover or the second cover includes a protrusion protruding toward a space between the first cover and the second cover, the first conductor and the second conductor are each provided with a through hole, and the through hole of the first conductor and the through hole of the second conductor receive the protrusion to connect the first and second conductors together. The protrusion ensures that the first conductor and the second conductor are secured to either the first cover or the second cover without variation.

Preferably, the protrusion has a tip having an outer diameter increased to be larger than an inner diameter of the through hole to secure the first and second conductors to the protrusion.

Preferably, the first conductor and the second conductor are connected via a thermosetting conductive adhesive.

Preferably, the connecting member further includes a third conductor provided between the first conductor and the second conductor, and the first conductor and the second conductor are connected to the third conductor. In that case, by incorporating an electronic component such as a diode in the third conductor, a function of the solar battery module can be enhanced.

The first cover or the second cover includes a first protrusion and a second protrusion protruding toward a space between the first cover and the second cover. The first conductor and the second conductor are each provided with a through hole and the third conductor is provided with first and second through holes. The through hole of the first conductor and a through hole of the third conductor receive the first protrusion to connect the first and third conductors together, and the through hole of the second conductor and a through hole of the third conductor receive the second protrusion to connect the second and third conductors together. The first and second protrusions ensure that the first, second and third conductors are secured to either the first cover or the second cover.

Preferably, the first protrusion has a tip having an outer diameter increased to be larger than an inner diameter of the through hole to secure the first and third conductors to the first protrusion, and the second protrusion has a tip having an outer diameter increased to be larger than an inner diameter of the through hole to secure the second and third conductors to the second protrusion.

The first conductor and the third conductor are connected via a thermosetting conductive adhesive, and the second conductor and the third conductor are connected via a thermosetting conductive adhesive.

Preferably, the third conductor includes a diode.

According to the above configuration, the first and second strings can be easily assembled.

The foregoing and other objects, features, aspects and advantages of the present invention will become more apparent from the following detailed description of the present invention when taken in conjunction with the accompanying drawings.

Hereinafter, a solar battery module according to each embodiment of the present invention, a mounting structure therefor, and a vehicle including the same will be described with reference to the drawings. In the following description, identical or corresponding components in the figures are identically denoted and will not be described repeatedly in detail.

First Embodiment

Figure 2:
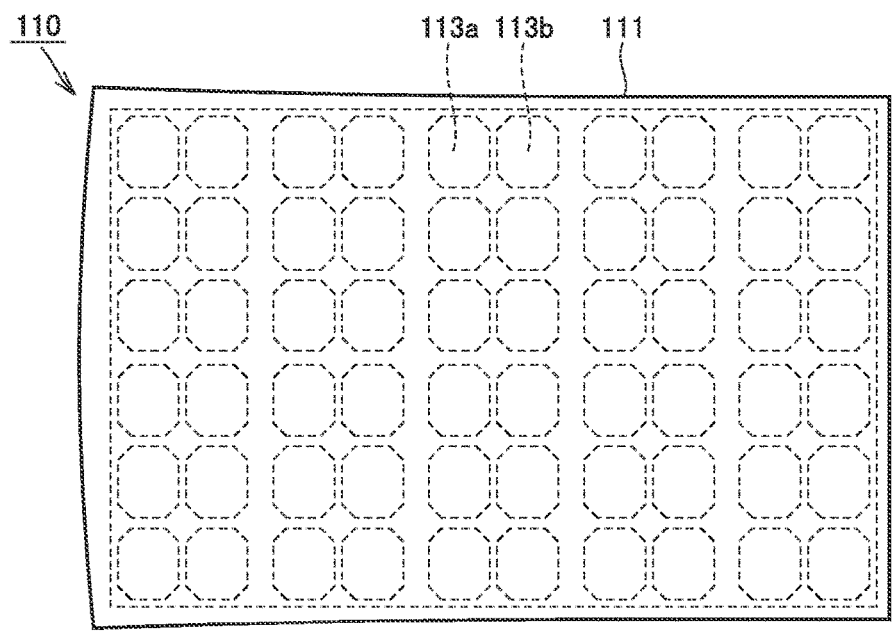
FIG. 2 is a plan view showing an appearance of a solar battery module included in the vehicle according to the first embodiment of the present invention, as seen in a direction indicated in FIG. 1 by an arrow II.
Figure 3:
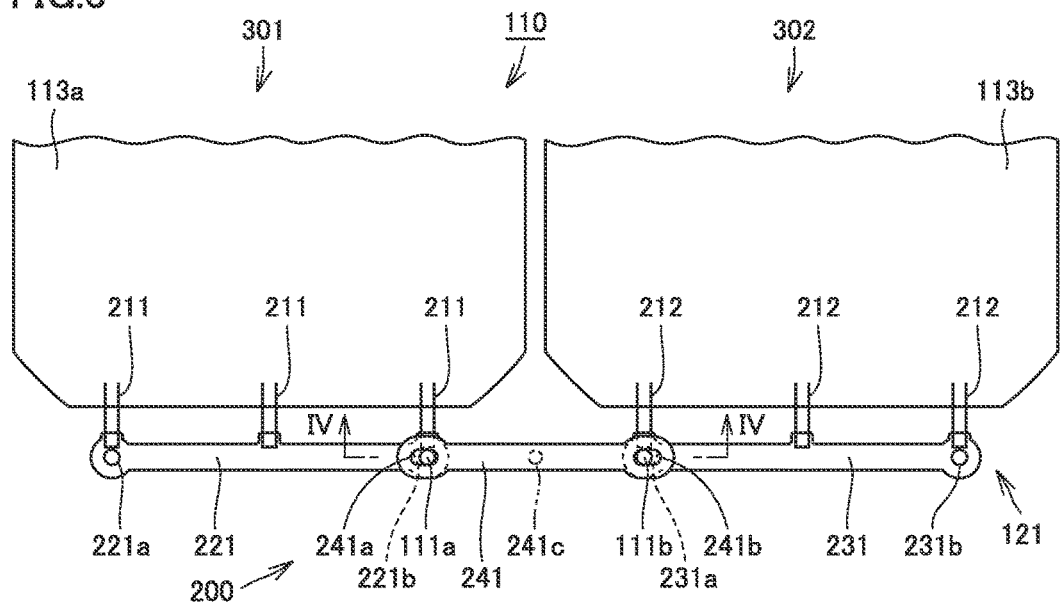
FIG. 3 is an enlarged plan view of a solar battery cell in FIG. 2.
Figure 4:
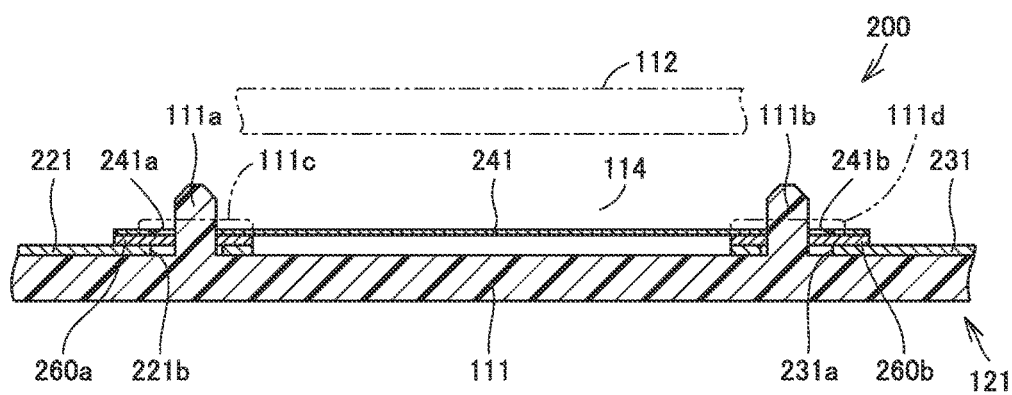
FIG. 4 is a cross-sectional view taken along a line IV-IV in FIG. 3.

FIG. 1 is a perspective view showing an appearance of a vehicle according to a first embodiment of the present invention. FIG. 2 is a plan view showing an appearance of a solar battery module included in the vehicle according to the first embodiment of the present invention, as seen in a direction indicated in FIG. 1 by an arrow II. FIG. 3 is an enlarged plan view of a solar battery cell in FIG. 2. FIG. 4 is a cross-sectional view taken along a line IV-IV in FIG. 3.

As shown in FIGS. 1 to 4, a vehicle 100 according to the first embodiment of the present invention is an automobile, and includes a solar battery module 110 configuring a roof and a roof side member 120 which is a part of a vehicular body. The vehicle is not limited to an automobile, and it may be a train, for example.

The solar battery module 110 includes a first cover 111 in the form of a plate as a front surface plate, a second cover 112 as a back surface plate disposed to face the first cover 111, a first solar battery cell 113a and a second solar battery cell 113b disposed between the first cover 111 and the second cover 112, and a sealing material (not shown) filling a gap between the first cover 111 and the second cover 112 and bonding them together to seal the first solar battery cell 113a and the second solar battery cell 113b.

The sealing material is located in a region sandwiched between the first cover 111 and the second cover 112. The sealing material is in contact with the first cover 111, the second cover 112, the first solar battery cell 113a, and the second solar battery cell 113b.

In the present embodiment, the sealing material is composed of EVA (ethylene-vinyl acetate). However, the material composing the sealing material is not limited to EVA, and it may be PVB (poly vinyl butyral), silicone resin or ionomer resin, polyolefin resin or the like.

The first cover 111 has a substantially rectangular shape in a plan view. While the first cover 111 is a flat plate in the present embodiment, it may be curved. In the present embodiment, the first cover 111 is a polycarbonate plate. However, the first cover 111 is not limited thereto, and it may be a plate made of another resin such as acryl. The first cover 111 is formed by injection-molding or extrusion-molding polycarbonate.

A portion of the first cover 111 that faces the first solar battery cell 113a and the second solar battery cell 113b is transparent. Solar light is transmitted through the transparent portion, and the solar battery cell 113 is irradiated therewith. A portion of the first cover 111 that does not face the first solar battery cell 113a and the second solar battery cell 113b may be opaque by being provided with a colored portion 121. Being thus opaque can shield a portion inside the first cover 111 and conceal a wiring, an adhesive and the like around the solar battery cell 113. The colored portion 121 shields visible light. It suffices that the colored portion 121 is not transparent, and the colored portion 121 may be not only of a chromatic color such as red, yellow, green, blue and violet, but also an achromatic color such as white, gray or black. The second cover 112 has a substantially rectangular shape in a plan view. In the present embodiment, the second cover 112 is in the form of a flat plate, however, when the first cover 111 is curved, the second cover 112 is curved with substantially the same curvature as the first cover 111.

In the present embodiment, the second cover 112 is a polycarbonate plate. However, the second cover 112 is not limited thereto, and it may be a plate made of another resin such as acryl, a plate made of carbon-fiber-reinforced plastic (CFRP) or a plate of a metal such as aluminum, or it may be a sheet made of resin such as polyethylene terephthalate.

The second cover 112 is formed by injection-molding polycarbonate. It may be formed by vacuum-forming a resin sheet. Furthermore, the second cover 112 may be transparent or opaque.

A plurality of first solar battery cells 113a and a plurality of second solar battery cells 113b are disposed such that the solar battery cells are disposed in a matrix and spaced from one another. The first solar battery cell 113a and the second solar battery cell 113b are electrically connected to each other. Specifically, a plurality of first solar battery cells 113a are connected with one another in series to form a first solar battery string 301. A plurality of second solar battery cells 113b are connected with one another in series to form a second solar battery string 302. The first solar battery string 301 and the second solar battery string 302 are connected to each other in parallel.

The first solar battery cell 113a and the second solar battery cell 113b are provided with interconnectors 211 and 212. The interconnectors 211 and 212 are terminals for externally extracting electric power generated by the first solar battery cell 113a and the second solar battery cell 113b.

As shown in FIG. 5 and FIG. 7, a plurality of first solar battery cells 113a are connected in series by interconnector 211. A plurality of second solar battery cells 113b are connected in series by interconnector 212.

In FIG. 5 and FIG. 7, the plurality of first solar battery cells 113a and the interconnector 211 between the plurality of first solar battery cells 113a configure the first solar battery string 301. The plurality of second solar battery cells 113b and the interconnector 212 between the plurality of second solar battery cells 113b configure the second solar battery string 302.

The interconnector 211 and a conductor 221 are connected by soldering. The interconnector 212 and a conductor 231 are connected by soldering. The conductor 221 has opposite ends provided with through holes 221a, 221b. The conductor 231 has opposite ends provided with through holes 231a, 231b. The conductors 221 and 231 each have a symmetrical shape. The conductors 221 and 231 may have identical shapes.

The first cover 111 has a plurality of bosses 111a and 111b. The plurality of bosses 111a and 111b extend to project inward from the first cover 111. The plurality of bosses 111a and 111b extend linearly. The plurality of bosses 111a and 111b have a cylindrical shape with a tip tapered (in the form of a truncated cone). The bosses 111a and 111b extend toward a region between the first cover 111 and the second cover 112. The shape of the bosses 111a and 111b is not limited to the above shape.

A conductor 241 is disposed between the conductor 221 and the conductor 231. The conductor 241 has opposite ends with through holes 241a, 241b. The boss 111a is inserted through the through hole 241a and the through hole 221b. The boss 111b is inserted through the through hole 241b and the through hole 231a. A through hole 241c may be provided between the through hole 241a and the through hole 241b. The through hole 241c may be positioned intermediate between the two through holes 241a and 241b or may be positioned close to either one of the two through holes 241a and 241b. A boss may be inserted through the through hole 241c. Similarly, the through hole 221a and the through hole 231b each also receive another boss provided to the first cover 111.

A thermosetting conductive adhesive 260a is provided between the conductor 241 and the conductor 221. A thermosetting conductive adhesive 260b is provided between the conductor 241 and the conductor 231. The conductor 241 and the conductor 221 may be bonded together by soldering, and so may the conductor 241 and the conductor 231. For this shape of solar battery module 110, the boss 111a has a tip melted by high temperature and thus thermally caulked, and thus deformed as indicated by a two-dot chain line 111c. Similarly, the boss 111b has a tip thermally caulked and thus deformed as indicated by a two-dot chain line 111d. The bosses inserted through the through holes 221a and 231b, respectively, are also similarly, thermally caulked.

The solar battery module 110 includes the first cover 111 in the form of an at least partially transparent plate, the second cover 112 disposed to face the first cover 111, the first solar battery string 301 disposed between the first cover 111 and the second cover 112 and having a plurality of first solar battery cells 113a electrically connected together to form the first solar battery string 301, the second solar battery string 302 disposed between the first cover 111 and the second cover 112 adjacent to the first solar battery string 301 and having a plurality of second solar battery cells 113b electrically connected together to form the second solar battery string 302, conductors 221, 231, 241 disposed between the first cover 111 and the second cover 112 along an end of the first solar battery string 301 and an end of the second solar battery string 302 and serving as a connecting member electrically connecting the first solar battery string 301 and the second solar battery string 302, and the sealing material 114 filling a gap between the first cover 111 and the second cover 112 and bonding them together to seal the first and second solar battery strings 301 and 302 and the connecting member. The connecting member includes the conductor 221 serving as a first conductor disposed along the end the first solar battery string 301 and connected to the first solar battery string 301, and the conductor 231 serving as a second conductor disposed along the end of the second solar battery string 302 and connected to the second solar battery string 302.

The connecting member further includes the conductor 241 serving as a third conductor provided between the conductor 221 and the conductor 231. The conductor 221 and the conductor 231 are connected to the conductor 241. In that case, by incorporating an electronic component such as a diode in the conductor 241, a function of the solar battery module 110 can be enhanced.

The first cover 111 or the second cover 112 includes the boss 111a as a first protrusion and the boss 111b as a second protrusion protruding toward a space between the first cover 111 and the second cover 112. The conductors 221, 231, 241 are provided with through holes 221a, 221b, 231a, 231b, 241a, 241b, and the through hole 221b and the through hole 241a as the first through hole receive the boss 111a to connect the conductors 221 and 241 together and the through hole 231a and the through hole 241b as the second through hole receive the boss 111b to connect the conductors 231 and 241 together.

The boss 111a has a tip thermally caulked to have an outer diameter larger than the inner diameter of the through holes 221b, 241a so that the conductors 221, 241 are secured to the boss 111a, and the boss 111b has an outer diameter increased to be larger than the inner diameter of the through holes 231a, 241b so that the conductors 231, 241 are secured to the boss 111b. The conductors 221 and 241 are connected via the thermosetting conductive adhesive 260a, and the conductors 231 and 241 are connected via the thermosetting conductive adhesive 260b.

The first solar battery string 301 and the second solar battery string 302 are covered with the first cover 111 and the second cover 112. The bosses 111a and 111b functions as a positioning portion for positioning at least one of the end of the first solar battery string 301 and the end of the second solar battery string 302 on the first cover 111.

In a process for manufacturing the solar battery module 110 shown in FIG. 1 to FIG. 4, initially, the first and second solar battery strings 301 and 302 are formed, and the interconnector 211 and the conductor 221 are connected to each solar battery string. This completes the first solar battery string 301 having the first solar battery cell 113a, the interconnector 211 and the conductor 221, and the second solar battery string 302 having the second solar battery cell 113b, the interconnector 212 and the conductor 231.

The first solar battery string 301 is placed on the first cover 111. The boss 111a is inserted through the through hole 221b. The second solar battery string 302 is placed on the first cover 111. The boss 111b is inserted through the through hole 231a. The through hole 221a and the through hole 231b also receive bosses associated therewith.

The conductive adhesives 260a, 260b are applied on the conductors 221, 231. The conductor 241 is placed on the conductive adhesives 260a and 260b. The boss 111a is inserted through the through hole 241a. The boss 111b is inserted through the through hole 241b.

While the bosses 111a, 111b have their tips heated, a force is applied to the tips of the bosses 111a, 111b. As the bosses 111a and 111b of resin heated are softened, the force applied to the tips of the bosses 111a and 111b allows the bosses 111a and 111b to have their tips increased in diameter in a lateral direction. As a result, the bosses 111a, 111b have their tips caulked and thus deformed as indicated by two-dot chain lines 111c, 111d. The bosses 111a and 111b have their tips having an outer diameter larger than the inner diameter of the through holes 241a and 241b, and the conductor 241 can be prevented from escaping from the bosses 111a and 111b. Similarly, the bosses inserted through the through hole 221a and the through hole 231b also have their tips thermally caulked.

This caulking process also heats the thermosetting conductive adhesives 260a and 260b. As a result, the conductive adhesives 260a and 260b are also set.

In the lamination process, the sealing material 114 is disposed between the first cover 111 and the second cover 112. The first cover 111 and the second cover 112 are heated. As a result, the sealing material 114 melts. After the lamination process, the temperature of the solar battery module 110 lowers to room temperature. As a result, the sealing material 114 solidifies.

In the solar battery module 110 configured as described above, the first solar battery string 301 and the second solar battery string 302 are divided, and when compared with a case where they are integrally formed, the first solar battery string 301 and the second solar battery string 302 can be easily assembled to the first cover 111. Furthermore, the first solar battery string 301 and the second solar battery string 302 are secured by using the bosses 111a and 111b. This reliably positions the first solar battery string 301 and the second solar battery string 302.

Furthermore, in a process for forming the first solar battery string 301 and the second solar battery string 302, the conductor 221 can be connected to the first solar battery string 301 and the conductor 231 can be connected to the second solar battery string 302, and a soldering operation in a process for producing the module can be reduced. Furthermore, as the conductors 221 and 231 are formed symmetrically, the conductors 221 and 231 can be used with their right and left sides inverted.

Second Embodiment

FIG. 5 is a plan view showing a portion of a solar battery module according to a second embodiment of the present invention. FIG. 6 is a cross-sectional view taken along a line VI-VI in FIG. 5. FIG. 7 is a plan view of the solar battery module according to the second embodiment of the present invention.

Referring to these figures, in the second embodiment, the second cover is provided with bosses 112a and 112b. The end portions of the first and second solar battery strings 301 and 302 that are not provided with the conductor 241 are connected to a diode 250.

Providing the diode 250 can prevent a reverse flow of a current flowing through the first solar battery string 301 and the second solar battery string 302. Furthermore, when some of the plurality of first solar battery cells 113a connected in series and the plurality of second solar battery cells 113b connected in series is/are shielded from light and cannot generate electric power, the diode 250 can prevent the entire module from failing to generate electric power. Furthermore, the above structure can be created merely by replacing the conductor 241 with the diode 250. This can be done without changing the conductors 221, 231.

Furthermore, in this embodiment, the second cover 112 is provided with the bosses 112a and 112b. The bosses 112a, 112b are inserted through the through holes of the conductors 221, 231, 241.

Third Embodiment

Figure 8:
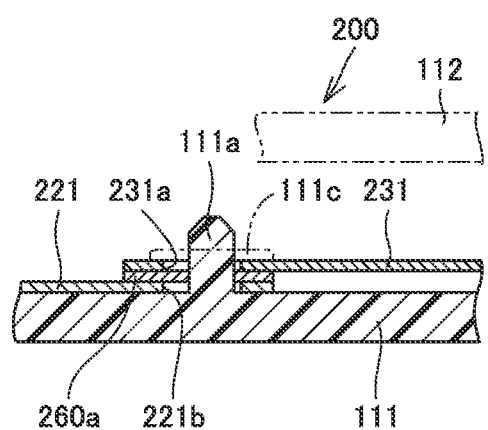
FIG. 8 is a cross-sectional view of a solar battery module according to a third embodiment of the present invention.

FIG. 8 is a cross-sectional view of a solar battery module according to a third embodiment of the present invention. In the third embodiment, the other conductor 241 is not interposed between the conductor 221 and the conductor 231. The through hole 221b of the conductor 221 and the through hole 231a of the conductor 231 receive the boss 111a. The boss 111a has a tip caulked and thus deformed as indicated by the two-dot chain lines 111c. The conductive adhesive 260a is interposed between the conductor 221 and the conductor 231.

The solar battery module according to the third embodiment configured as described above does not have another conductor interposed between the conductor 221 and the conductor 231 and thus does not require conductor 241 as provided in the first and second embodiments. As a result, the number of parts can be reduced.

While an embodiment and an example have been described, it should be understood that the above disclosure is illustrative and non-restrictive in any respect. The scope of the present invention is defined by the terms of the claims, and is intended to include any modifications within the meaning and scope equivalent to the terms of the claims.

INDUSTRIAL APPLICABILITY

The present invention is applicable for example in a field of solar battery modules mounted on vehicles.

While the present invention has been described in embodiments, it should be understood that the embodiments disclosed herein are illustrative and non-restrictive in any respect. The scope of the present invention is defined by the terms of the claims, and is intended to include any modifications within the meaning and scope equivalent to the terms of the claims.

What is claimed is:

1. A solar battery module comprising:
   a first cover in a form of an at least partially transparent plate;
   a second cover disposed to face the first cover;
   a first string disposed between the first cover and the second cover and having a plurality of first solar battery cells electrically connected together to form the first string;
   a second string disposed between the first cover and the second cover adjacent to the first string and having a plurality of second solar battery cells electrically connected together to form the second string;
   a connecting member disposed between the first cover and the second cover along an end of the first string and an end of the second string and electrically connecting the first string and the second string; and
   a sealing material filling a gap between the first cover and the second cover and bonding them together to seal the first and second strings and the connecting member,
   wherein the connecting member includes a first conductor disposed along the end of the first string and is connected to the first string and a second conductor disposed along the end of the second string and is connected to the second string, wherein the first conductor and the second conductor are electrically connected, wherein the connecting member further includes a third conductor provided between the first conductor and the second conductor, wherein the first conductor and the second conductor are connected to the third conductor, wherein the first cover or the second cover includes a first protrusion and a second protrusion protruding toward a space between the first cover and the second cover, wherein the first conductor is provided with a first through hole, the second conductor is provided with a second through hole and the third conductor is provided with a third through hole and a fourth through hole, wherein the first through hole of the first conductor and the third through hole of the third conductor receive the first protrusion to connect the first and third conductors together, wherein the second through hole of the second conductor and the fourth through hole of the third conductor receive the second protrusion to connect the second and third conductors together, wherein the third conductor includes a diode, and wherein the first conductor, the third conductor, and the second conductor are linearly connected in respective order such that the first conductor, the third conductor, and the second conductor extend in a substantially same direction.

2. The solar battery module according to claim 1, wherein at least one of the first protrusion and the second protrusion has a tip having an outer diameter increased to be larger than an inner diameter of the first through hole or the second through hole to secure the first conductor to the first protrusion or the second conductor to the second protrusion.

3. The solar battery module according to claim 1, wherein the first conductor or the second conductor are connected to the third conductor via a thermosetting conductive adhesive or solder.

4. The solar battery module according to claim 1, wherein the first protrusion has a tip having an outer diameter increased to be larger than an inner diameter of the first through hole and the third through hole to secure the first conductor and the third conductor to the first protrusion, and the second protrusion has a tip having an outer diameter increased to be larger than an inner diameter of the second through hole and the fourth through hole to secure the second conductor and the third conductor to the second protrusion.

5. The solar battery module according to claim 1, wherein the first conductor and the third conductor are connected via a thermosetting conductive adhesive or solder, and the second conductor and the third conductor are connected via a thermosetting conductive adhesive or solder.

* * * * *